(12) United States Patent
LeFranc et al.

(10) Patent No.: US 7,319,196 B2
(45) Date of Patent: Jan. 15, 2008

(54) BONDING WIRE AND BONDED CONNECTION

(75) Inventors: Guy LeFranc, Munich (DE); Christof Klos, Warstein (DE)

(73) Assignee: EUPEC Europaeische Gesellschaft fur Leistungshalbleiter mbH (DE)

( * ) Notice: Subject to any disclaimer, the term of this patent is extended or adjusted under 35 U.S.C. 154(b) by 176 days.

(21) Appl. No.: 11/221,112

(22) Filed: Sep. 6, 2005

(65) Prior Publication Data

US 2006/0055041 A1 Mar. 16, 2006

(30) Foreign Application Priority Data

Sep. 6, 2004 (DE) ...................... 10 2004 043 020

(51) Int. Cl.
*H01B 7/34* (2006.01)

(52) U.S. Cl. ................................. 174/126.1

(58) Field of Classification Search .................. 174/36, 174/110 R, 110 A, 115, 116, 118, 119 R, 174/126.1, 126.2
See application file for complete search history.

(56) References Cited

U.S. PATENT DOCUMENTS

| | | | | |
|---|---|---|---|---|
| 2,593,922 A | * | 4/1952 | Preston et al. | 205/198 |
| 2,975,078 A | * | 3/1961 | Rayfield | 428/384 |
| 2,984,894 A | * | 5/1961 | Hill | 428/554 |
| 3,731,374 A | * | 5/1973 | Suenaga et al. | 29/599 |
| 4,143,238 A | * | 3/1979 | Sheth | 174/107 |
| 4,843,356 A | * | 6/1989 | Lusignan et al. | 333/236 |
| 5,045,527 A | * | 9/1991 | Ikeno et al. | 505/410 |
| 5,067,007 A | * | 11/1991 | Otsuka et al. | 257/701 |
| 5,091,609 A | * | 2/1992 | Sawada et al. | 174/110 A |
| 5,364,706 A | * | 11/1994 | Toyofuku et al. | 428/607 |
| 5,415,922 A | * | 5/1995 | Tatsumi et al. | 428/220 |
| 5,498,296 A | * | 3/1996 | Sawada et al. | 136/236.1 |
| 5,554,443 A | * | 9/1996 | Kondo et al. | 428/375 |
| 6,559,385 B1 | * | 5/2003 | Johnson et al. | 174/126.1 |
| 6,576,844 B1 | * | 6/2003 | Kamata | 174/126.1 |
| 6,649,843 B2 | * | 11/2003 | Aoyama et al. | 174/126.1 |
| 6,899,777 B2 | * | 5/2005 | Vaidyanathan et al. | 156/89.11 |
| 2002/0117330 A1 | * | 8/2002 | Eldridge et al. | 174/260 |
| 2004/0014266 A1 | * | 1/2004 | Uno et al. | 438/200 |
| 2004/0065468 A1 | * | 4/2004 | Seuntjens | 174/94 R |

FOREIGN PATENT DOCUMENTS

DE 102 14 953 4/2002

OTHER PUBLICATIONS

German Preliminary Examination Report, DE 10 2004 043 020.9-34; 2 pp., Jun. 6, 2004.

* cited by examiner

*Primary Examiner*—William H. Mayo, III
(74) *Attorney, Agent, or Firm*—Coats & Bennett, P.L.L.C.

(57) ABSTRACT

A bonding wire (1) includes a matrix material (2) and a filler (3) embedded in this matrix material (2), the coefficient of thermal expansion of the filler (3) being lower than the coefficient of thermal expansion of the matrix material (2), and the filler (3) content by weight amounting to at least 25% of the weight of the bonding wire (1). Also, a bonded connection between a bonding wire and a substrate may use such a bonding wire.

22 Claims, 4 Drawing Sheets

BONDING WIRE AND BONDED CONNECTION

CROSS-REFERENCE TO RELATED APPLICATIONS

This application claims priority to German Patent Application No. 10 2004 043 020.9-34, which was filed on Sep. 6, 2004, and is incorporated herein by reference in its entirety.

TECHNICAL FIELD

The invention relates to a bonding wire and a bonded connection between a metallization arranged on a semiconductor body and a bonding wire.

BACKGROUND

Bonding wires and bonded connections of this type are often used for semiconductor components to electrically contact-connect a semiconductor body. In the region which is to be contact-connected, for example a load or control terminal of a power semiconductor component, the semiconductor body typically has a metallization, generally formed from aluminum or an aluminum alloy. The contact-connection of the semiconductor body is in this case realized by means of a bonded connection formed between the metallization and the bonding wire.

When the connection location is heated, as typically occurs when a semiconductor component of this type is operating, the bonded connection is exposed to high thermomechanical stresses on account of the very different longitudinal expansion coefficients of the semiconductor body and the bonding wire. Since these thermomechanical stresses cannot be sufficiently reduced within the metallization, on account of the usually very low thickness of the metallization, in particular after prolonged operating times with frequent temperature changes or high temperature differences, delamination can occur in the region of the bonded connection, causing the semiconductor component to fail.

SUMMARY

Therefore, the object of the present invention is to provided a bonding wire for producing a bonded connection between a bonding wire and a semiconductor body, and also a bonded connection of this type, which has a higher reliability than a bonded connection of the prior art in the event of frequently and/or strongly fluctuating temperatures.

The bonding wire according to the invention includes a matrix material and a filler which is embedded in the matrix material. The coefficient of thermal expansion of the filler is lower than the coefficient of thermal expansion of the matrix material. Furthermore, the filler content amounts to at least 25% weight of the bonding wire.

A bonding wire comprising a matrix material and a filler embedded therein, wherein the coefficient of thermal expansion of the filler is lower than the coefficient of thermal expansion of the matrix material, and the filler content amounting to at least 25% of the weight of the bonding wire.

The matrix material can be aluminum, copper or an alloy comprising at least one of these elements. The filler can be a ceramic material or includes a ceramic material. The ceramic material may include silicon carbide, aluminum nitride, aluminum oxide or a mixture of at least two of these substances. The filler can be formed from silicon and/or carbon or includes at least one of these materials. The filler content may amount to between 50% by weight and 80% by weight of the bonding wire. The bonding wire may have a coefficient of linear thermal expansion of at most 18 ppm/K. The filler may have a mean grain size of less than 10% of the diameter of the bonding wire. The bonding wire may comprise a first filament, the filler content of which is greater than the filler content of the region of the bonding wire which adjoins the first filament. The first filament may have a diameter which amounts to between 70% and 95% of the diameter of the bonding wire. The bonding wire may further comprise at least one second filament, which has a diameter amounting to between 5% and 20% of the diameter of the bonding wire. The first filament can be surrounded by at least one sheath layer. The filler content of the first filament can be greater than the filler content of the innermost of the sheath layers. The bonding wire may further comprise at least two sheath layers, the filler content of a sheath layer being greater than the filler content of each sheath layer situated further toward the outside. The filler content of the outermost of the sheath layers can be less than 5% by weight. The bonding wire may further comprise at least one second filament, the filler content of which is greater than the filler content of the region of the bonding wire which adjoins the at least one second filament. The diameter of the bonding wire can be at least 50 µm.

The object can also be achieved by a bonded connection between a bonding wire comprising a matrix material and a filler embedded therein, wherein the coefficient of thermal expansion of the filler is lower than the coefficient of thermal expansion of the matrix material, and the filler content amounting to at least 25% of the weight of the bonding wire, and a substrate.

The substrate can be substantially formed from silicon, germanium or gallium arsenide.

The bonded connection can be formed directly between a metallization of the substrate and the bonding wire. The metallization may have a thickness of between 2 µm and 50 µm. The bonded connection can be produced by means of an ultrasound bonding process.

The admixing of filler which has a lower coefficient of thermal expansion than the matrix material means that the coefficient of thermal expansion of the bonding wire according to the invention is also lower than the coefficient of thermal expansion of the matrix material. The higher the filler content, the lower the coefficient of thermal expansion of the bonding wire.

If a bonding wire according to the invention is used instead of a convention bonding wire to produce a bonded connection between a bonding wire and a metallization of a semiconductor body, the thermomechanical stresses which were mentioned in the introduction, occur in the region of the bonded connection and are caused by temperature changes, are significantly reduced.

Although the prior art has disclosed bonding wires made from aluminum-silicon (AlSi), these wires have a filler content of only 1% by weight of silicon (AlSi1). The admixing of silicon in this case serves to improve the drawing properties and working properties of the bonding wire. However, the coefficient of thermal expansion of the bonding wire is not significantly reduced by admixing just 1% of silicon. Furthermore, AlSi1 bonding wires according to the prior art are only used for thin wire bonding with bonding wire diameters of less than 125 µm, whereas bonding wires according to the invention—as explained in more detail below—can also be used for thick wire bonding with bonding wire diameters of 125 µm or above.

A bonding wire in accordance with the prior art, formed for example from aluminum, has a coefficient of linear thermal expansion at 20° C. of approximately 23 ppm/K (1 ppm=$10^{-6}$) By comparison, the coefficient of linear thermal expansion of a bonding wire according to the invention whereof the matrix material is aluminum to which 25% by weight of silicon powder has been admixed as filler, is approximately 18 ppm/K.

If a bonded connection between a bonding wire and a substrate, for example a silicon semiconductor body, is produced at a first temperature T1, and if the bonded connection is then brought to a second temperature T2, thermomechanical stresses occur between the substrate and the bonding wire, the strength of which thermomechanical stresses is dependent not only on the difference between the temperatures T1 and T2 but in particular also on the difference between the coefficients of the thermal expansion of the bonding wire and the substrate. The lower the difference between the coefficients of thermal expansion of the bonding wire and the substrate, the lower the thermomechanical stresses.

BRIEF DESCRIPTION OF THE DRAWINGS

The invention is explained in more detail below with reference to figures, in which.

In the figures, identical reference designations denote identical parts having the same meaning.

DETAILED DESCRIPTION

Figure 1:
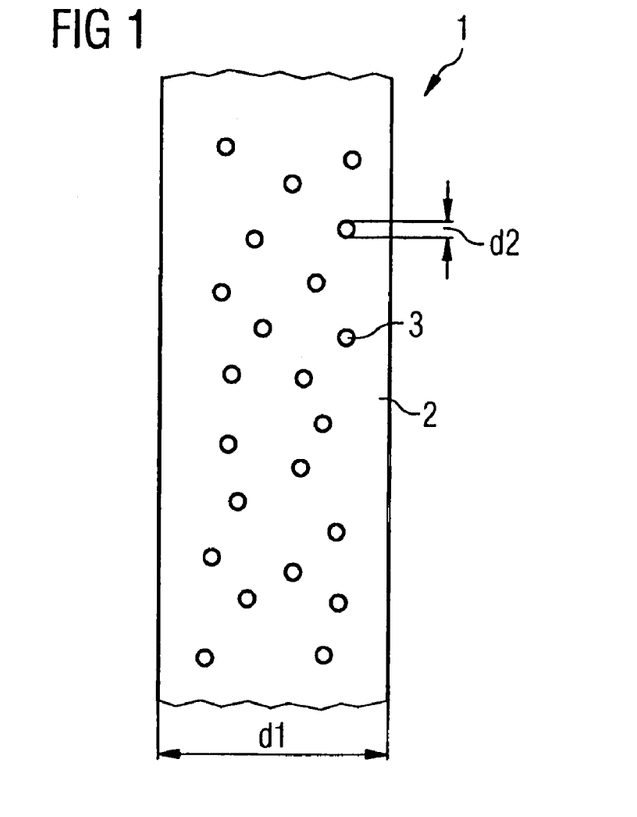
FIG. 1 shows part of a bonding wire according to the invention, in which the filler is distributed homogeneously in the matrix material, in cross section.

FIG. 1 shows part of a bonding wire 1 according to the invention in cross section. The bonding wire 1 is formed from a matrix material 2, for example aluminum, and a filler 3. In addition to aluminum, it is in principle also possible to use other materials, such as for example copper, as matrix material 2. However, aluminum or aluminum alloys are very particularly suitable for use as matrix material 2 on account of their good compatibility with semiconductors and on account of their good thermal, electrical and mechanical properties.

The filler 3 is added to the matrix material 2, preferably in powder form, during the production of the bonding wire 1. However, the addition of the filler 3 may be accompanied by a hardening, for example dispersion hardening, of the matrix material 2. Since hardening phenomena of this nature are dependent on the grain size, i.e. the diameters d2 of the grains of the filler 3 added, it is advantageous for the grain size and/or its distribution or the mean of the grain size of the filler 3 to be selected in such a way that undesirable hardening is as far as possible avoided or at least reduced to a level which is unavoidable. The mean grain size of the filler 3 is preferably less than 10% of the bonding wire diameter, and is preferably less than 20 µm, particularly preferably less than 5 µm. To achieve isotropic properties of the bonding wire, it is advantageous if the filler is distributed homogeneously in the matrix material.

A bonding wire 1 according to the invention preferably has a bonding wire diameter d1 of at least 50 µm. The bonding wire diameter d1 may be selected to be between 50 µm and 125 µm, as is customary with conventional bonding methods, or alternatively, it is also possible for bonding wires of this type to be used even for thick wire bonding with bonding wire diameters d1 of at least 125 µm, preferably between 125 µm and 500 µm, particularly preferably between 200 µm and 500 µm. In principle, however, bonding wires of this type can also be used for thin wire bonding, in which case the bonding wire diameters d1 are less than 50 µm, preferably between 17 µm and 50 µm.

To achieve the effect of reducing the coefficient of thermal expansion of the matrix material 2 which the admixing of the filler 3 is intended to bring about, it is necessary for the filler 3 to have a coefficient of thermal expansion which is lower than the coefficient of thermal expansion of the matrix material 2. For this reason, suitable fillers 3 are preferably ceramic materials, such as for example silicon carbide, aluminum nitride, aluminum oxide or a mixture of at least two of these substances. However, there is also provision for the filler 3 used at least in part to be silicon and/or carbon.

A further criterion relating to the choice and quantity of the filler 3 may, in particular if high currents are to be passed through the bonding wire 1, consist in the electrical conductivity of the bonding wire not been excessively reduced by the admixing of the filler. In practice, however, this point is of subordinate importance, since a reduced conductivity can generally be compensated for by using a correspondingly thicker bonding wire.

Figure 2:
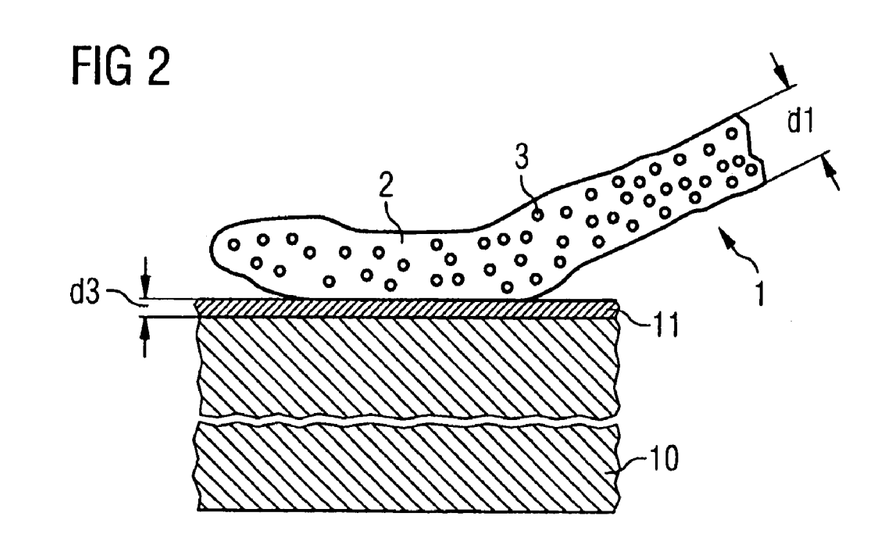
FIG. 2 shows a cross section through a bonded connection according to the invention.

FIG. 2 shows a bonded connection according to the invention between a bonding wire 1 according to the invention and a substrate 10. The substrate 10 may, for example, be a semiconductor body, e.g. the semiconductor chip of a power semiconductor component, such as a MOSFET or an IGBT, which is formed in particular from silicon, germanium, gallium arsenide or any other desired semiconductor material. A bonded connection has been formed between the bonding wire 1 and the substrate 10 in order for the substrate 10 or a defined section of the substrate 10 to be electrically connected by means of the bonding wire 1 to another element, for example a terminal pin of a semiconductor component.

To realize a bonded connection of this type, the substrate 10 preferably has a metallization 11, which may be formed, for example, as a metallization of a power semiconductor chip or as a bonding pad, to which the bonding wire 1 is directly connected. The thickness d3 of metallizations 11 of this type is preferably between 2 µm and 50 µm, preferably less than 5 µm, and is therefore so low that the thermomechanical stresses between the substrate 10 and the bonding wire 1 induced by temperature changes cannot be sufficiently reduced within the metallization 11. The use of a bonding wire 1 according to the invention, which has a filler content 3 of at least 25% by weight reducing the coefficient of thermal expansion, also reduces the strength of these thermomechanical stresses induced by temperature changes, which greatly improves the long-term stability of a bonded connection of this type.

Figure 3:
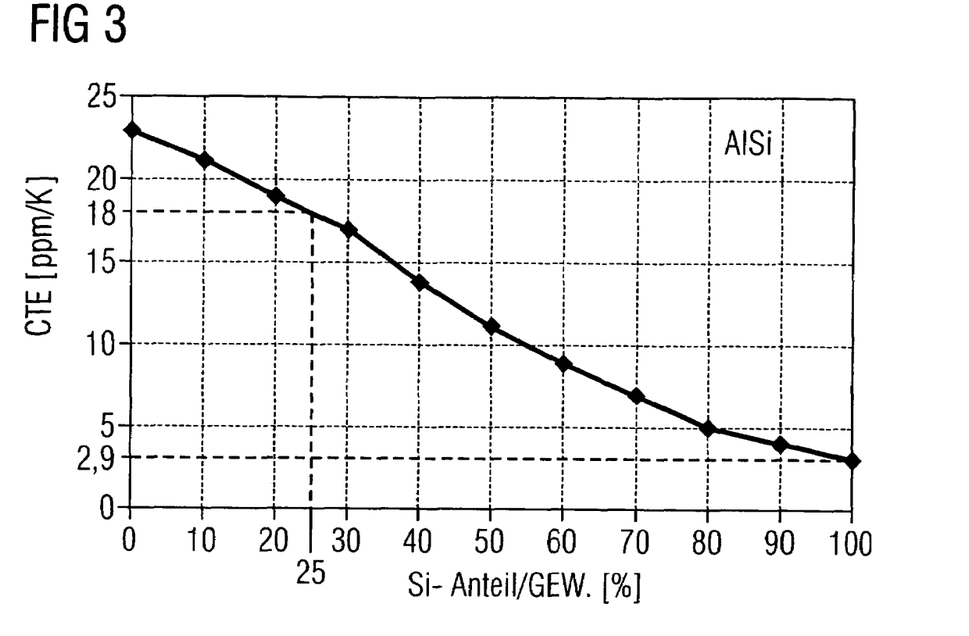
FIG. 3 shows the relationship between the coefficient of linear thermal expansion of a bonding wire according to the invention and the silicon filler content of an aluminum bonding wire.

FIG. 3 shows a typical profile of the coefficient of linear thermal expansion (CTE) of a bonding wire 1, the matrix material 2 of which is formed from aluminum, as a function of the content by weight, based on the weight of the bonding wire, of a silicon powder admixed with the aluminum. Pure aluminum, i.e. with a silicon content of 0% by weight, has a coefficient of linear thermal expansion of 23 ppm/K. As the silicon content increases, the coefficient of linear thermal expansion drops, reaching the coefficient of linear thermal expansion of silicon, which literature references give as approximately 2.9 ppm/K, when the silicon content reaches 100%, i.e. pure silicon without any aluminum. Consequently, the ratio of the coefficient of longitudinal thermal expansion of pure aluminum to pure silicon is approx. 7.9:1.

As a modification to this, depending on the source, the values given for the coefficient of linear thermal expansion for pure aluminum are approximately between 23 ppm/K and 25 ppm/K and for pure silicon are approximately between 2.5 ppm/K and 3 ppm/K, meaning that the ratio of the coefficient of longitudinal thermal expansion of pure aluminum to pure silicon is between 7.7:1 and 10:1. Consequently, the coefficients of linear thermal expansion of aluminum and silicon differ significantly.

A bonding wire 1 according to the invention, which in accordance with the exemplary embodiment above is formed from aluminum with a silicon content of at least 25% by weight, has a coefficient of linear thermal expansion—as can be seen from FIG. 3—of less than 18 ppm/K.

If, working on the basis of the abovementioned values, a bonded connection which has been produced between a substrate 10 and a bonding wire 1 at a first temperature T1 and has then been brought to a second temperature T2, is considered, thermomechanical stresses, the magnitude of which depends on the difference between the temperatures T1 and T2 and in particular on the difference between the coefficients of linear thermal expansion of the substrate 10 and of the bonding wire 1, are produced the substrate 10 band the bonding wire 1.

If the semiconductor substrate 10 is in the form, for example, of a silicon crystal and therefore has a coefficient of linear thermal expansion of approximately 2.9 ppm/K, the difference between this coefficient of linear thermal expansion and the coefficient of linear thermal expansion of a bonding wire formed from pure aluminum according to the prior art is approximately 20.1 ppm/K (=23 ppm/K−2.9 ppm/K).

If a bonded connection in which—under otherwise identical conditions—the bonding wire in accordance with the prior art has been replaced by a bonding wire 1 according to the invention with a matrix material 2 of aluminum and a filler content of 25% by weight of silicon powder (which corresponds to a coefficient of linear thermal expansion of 18 ppm/K), is considered, the difference between the coefficients of linear thermal expansion of the substrate 10 and of the bonding wire 1 is approximately 15.1 ppm/K (=18 ppm/K−2.9 ppm/K), which corresponds to an approximately 25% improvement compared to a bonded connection according to the prior art.

Figure 4:
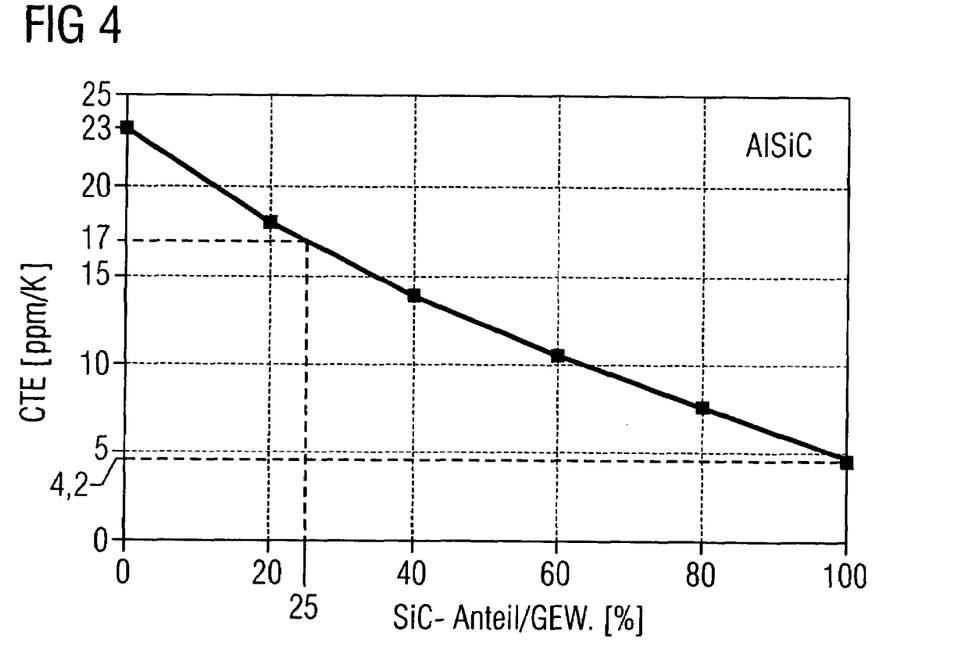
FIG. 4 shows the same relationship for the coefficient of linear thermal expansion shown in FIG. 3, except that the filler is silicon carbide instead of silicon.

FIG. 4, like FIG. 3, shows the coefficient of linear thermal expansion of a bonding wire 1 according to the invention having a matrix material 2 of aluminum as a function of the content by weight of a filler 3 which is distributed homogeneously in the matrix material 2 but unlike the AlSi alloy on which FIG. 3 is based is formed—under otherwise identical conditions—from silicon carbide powder. At silicon carbide powder contents of 0% by weight, 25% by weight and 100% by weight, the bonding wire has expansion coefficients of approximately 23 ppm/K, 17 ppm/K and 4.2 ppm/K.

A calculation of the difference between the coefficients of linear thermal expansion of an aluminum bonding wire with a silicon carbide powder content of 25% by weight and a silicon substrate gives 14.1 ppm/K (=17 ppm/K−2.9 ppm/K), which corresponds to a reduction in this difference of approximately 33% compared to the difference of 21.1 ppm/K in the case of a pure aluminum bonding wire.

As an alternative to a homogeneous distribution of the filler within the entire bonding wire, a bonding wire according to the invention may also have a core which is surrounded by one or more sheath layers that are preferably coaxial with respect to the core. In this case, at least the core and optionally at least one of the sheath layers is formed from a matrix material, in which a filler, preferably in the form of a powder, is embedded, the filler preferably being distributed homogeneously in the core and—if a sheath layer includes a filler—within the respective sheath layer. The filler content of the core is in this case higher than the filler content of the region of the bonding wire which adjoins the core.

The matrix materials and fillers which have already been described above are provided as matrix material and as filler for at least the core and optionally also at least one of the sheath layers. If the filler is in powder form, the preferred grain sizes are preferably less than 10% of the bonding wire diameter d1. The filler content of the core is in this case at least 25% by weight, preferably between 50% by weight and 80% by weight.

Figure 5:
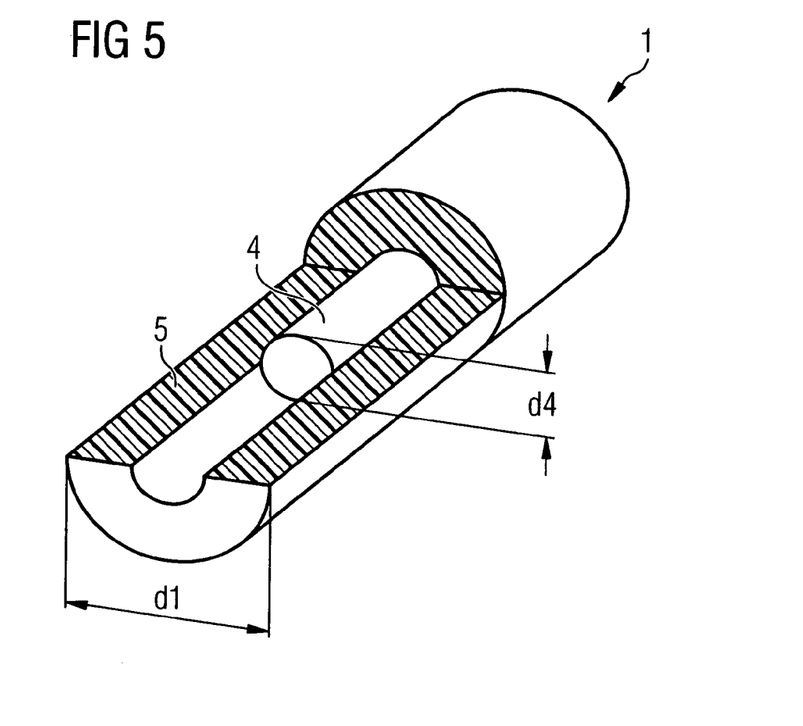
FIG. 5 shows part of a bonding wire according to the invention, which has a sheathed core, the core having a coefficient of thermal expansion which is lower than that of the sheath, in the form of a partially cut-away view.

A bonding wire of this type, having a core 4 and a single sheath layer 5, is illustrated in FIG. 5. The core 4 having a diameter d4 is formed from a matrix material, for example from aluminum, an aluminum alloy or copper, and a filler, for example a powder comprising silicon, carbon or a ceramic powder, e.g. comprising silicon carbide, aluminum oxide or aluminum nitride.

The material used for the sheath layer 5 is preferably the matrix material of the core 4, i.e. aluminum or an aluminum alloy. A filler comprising one or more of the filler materials described above may optionally also be added to the sheath layer 5, in which case it is advantageous for the production of a bonded connection for the filler content of the sheath layer 5 to be selected to be low, preferably less than 25% by weight.

In this exemplary embodiment too, the total filler content amounts to at least 25% by weight, based on the entire bonding wire.

Accordingly, a bonding wire 1 which includes a core 4 and at least two sheath layers is preferably constructed in such a way that the filler content of a sheath layer is greater than the filler content of each sheath layer situated further toward the outside. In this case, it is advantageous if the outermost of the sheath layers contains no filler or has only a very low filler content of preferably less than 5% by weight. The diameter d4 of the core 4 is preferably between 70% and 95% of the diameter d1 of the bonding wire.

According to a further preferred embodiment, a bonding wire according to the invention may instead of a core also have two or more filaments which are embedded in a mixed matrix. A core and a filament are fundamentally identical, and do not differ in terms of their internal structure. The expression "core" for the filament of a bonding wire is only used when this is the only filament of the bonding wire.

Figure 6:
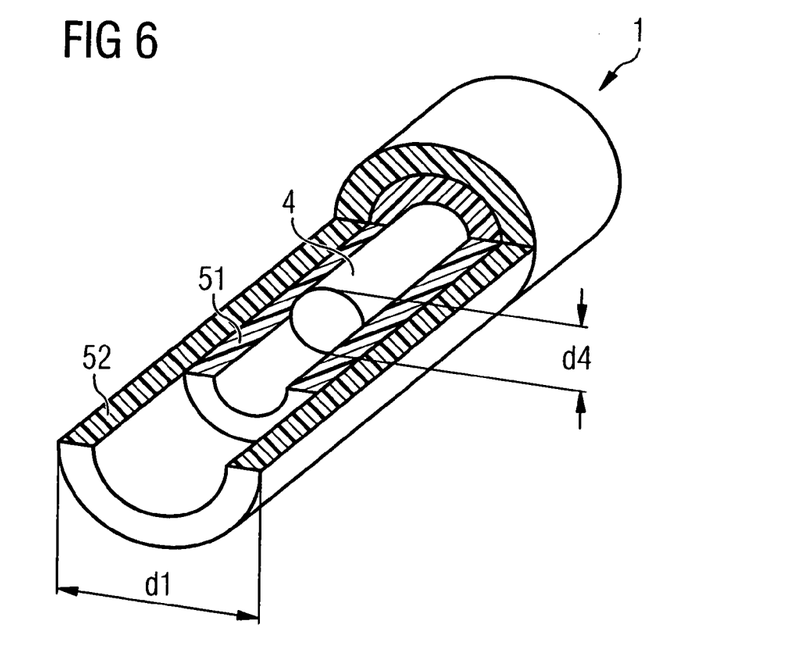
FIG. 6 shows part of a bonding wire according to the invention, which has a sheathed core, the sheath comprising two sheath layers.

FIG. 6 shows part of a bonding wire according to the invention which has a sheathed core 4, with the sheath being formed from two sheath layers 51, 52. The core 4 is surrounded by an inner sheath layer 51 and by an outer sheath layer 52. One or more further sheath layers may optionally also be arranged between the inner sheath layer 51 and the outer sheath layer 52.

The core 4, the inner and outer sheath layers 51 and 52, respectively, as well as any further sheath layers, preferably have a matrix material from among the matrix materials which have already been mentioned, in particular aluminum or an aluminum alloy, in which a filler may optionally be embedded. The core 4 and the inner, outer and any further sheath layers, differ primarily by virtue of their coefficients of thermal expansion and therefore, if the same matrix and filler materials are in each case used for the core and the sheath layers, by virtue of their filler contents. In this case, the coefficient of thermal expansion decreases starting from the inner sheath layer 51, via any further sheath layers, to the outer sheath layer 52 with each subsequent sheath layer. In particular, the filler content of the outer sheath layer 52 may even be equal to zero. The core 4 preferably has a higher filler content than the inner sheath layer 51.

Figure 7:
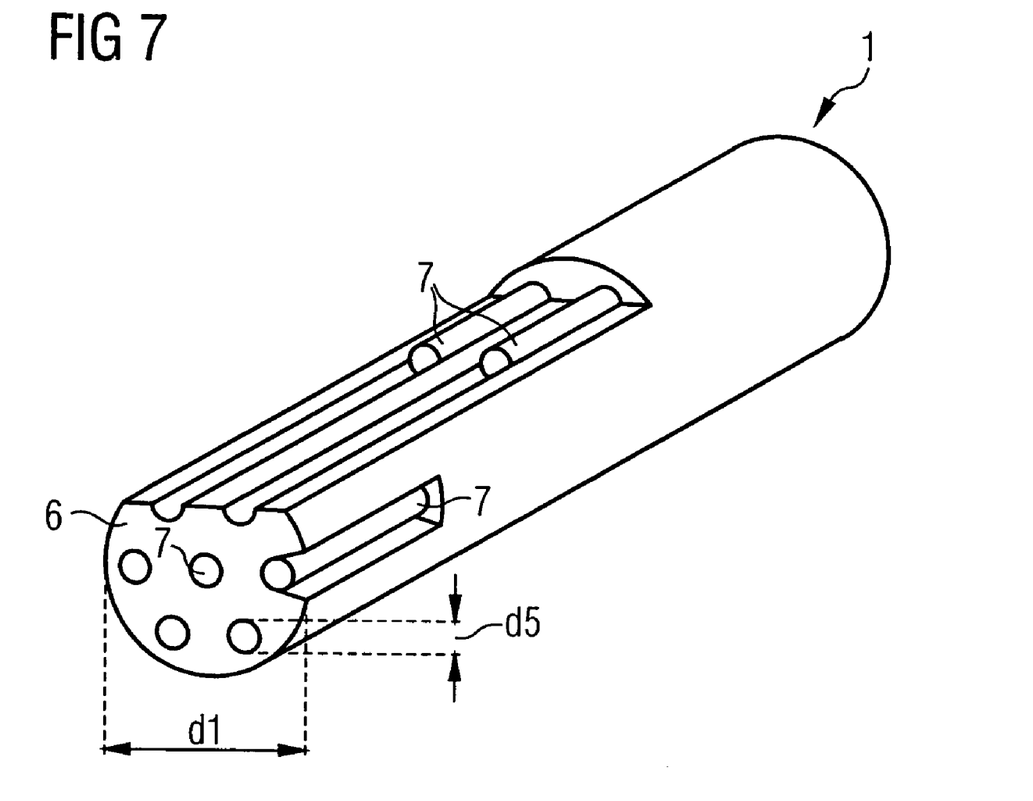
FIG. 7 shows part of a bonding wire according to the invention with filaments, the filler content of which is greater than the filler content of the region of the bonding wire which adjoins the filaments, in partially cut-away view.

FIG. 7 illustrates part of a bonding wire 1 with seven such filaments 7, 71 which are embedded in a mixed matrix 6. In terms of the structure and materials used, the filaments 7, 71 are formed, in a corresponding way to the core 4 which is known from FIG. 5, from a matrix material to which a filler with a reduced coefficient of thermal expansion compared to the matrix material has been added.

It is preferable for the bonding wire 1 according to the invention to include a first filament 7, which particularly preferably forms the core of the bonding wire 1, as described in more detail in FIG. 5. According to a further preferred embodiment, the bonding wire 1 comprises at least one second filament 71.

The diameter d5 of a filament 7, 71, if the filament does not form the core of the bonding wire, is preferably between 5% and 20% of the diameter d1 of the bonding wire 1, in which case different filaments 7, 71 may also have different diameters d5.

The bonded connections according to the invention are preferably produced by means of the known ultrasound bonding process.

List of Designations 1 bonding wire
 2 matrix material
 3 filler
 4 core
 5 sheath
 6 mixed matrix
 51 inner sheath layer
 52 outer sheath layer
 7, 71 filament
 10 substrate
 11 metallization
 d1 diameter of bonding wire
 d2 grain diameter of the filler
 d3 thickness of the metallization
 d4 thickness of the core
 d5 thickness of a filament

What is claimed is:

1. A single bonding wire comprising a matrix material and a filler embedded therein, wherein the coefficient of thermal expansion of the filler is lower than the coefficient of thermal expansion of the matrix material, and the filler content amounting to at least 25% of the weight of the single bonding wire.

2. A bonding wire according to claim 1, wherein the matrix material is aluminum, copper or an alloy comprising at least one of these elements.

3. A bonding wire according to claim 1, wherein the filler is a ceramic material or includes a ceramic material.

4. A bonding wire according to claim 3, wherein the ceramic material includes silicon carbide, aluminum nitride, aluminum oxide or a mixture of at least two of these substances.

5. A bonding wire according to claim 1, wherein the filler is formed from silicon and/or carbon or includes at least one of these materials.

6. A bonding wire according to claim 1, wherein the filler content amounts to between 50% by weight and 80% by weight of the bonding wire.

7. A bonding wire according to claim 1, having a coefficient of linear thermal expansion of at most 18 ppm/K.

8. A bonding wire according to claim 1, wherein the filler has a mean grain size of less than 10% of the diameter of the bonding wire.

9. A bonding wire according to claim 1, comprising a first filament, the filler content of which is greater than the filler content of the region of the bonding wire which adjoins the first filament.

10. A bonding wire according to claim 9, wherein the first filament has a diameter which amounts to between 70% and 95% of the diameter of the bonding wire.

11. A bonding wire according to claim 9, comprising at least one second filament, which has a diameter amounting to between 5% and 20% of the diameter of the bonding wire.

12. A bonding wire according to claim 9, wherein the first filament is surrounded by at least one sheath layer.

13. A bonding wire according to claim 12, wherein the filler content of the first filament is greater than the filler content of the innermost of the sheath layers.

14. A bonding wire according to claim 12, comprising at least two sheath layers, the filler content of a sheath layer being greater than the filler content of each sheath layer situated further toward the outside.

15. A bonding wire according to claim 12, wherein the filler content of the outermost of the sheath layers is less than 5% by weight.

16. A bonding wire according to claim 9, comprising at least one second filament, the filler content of which is greater than the filler content of the region of the bonding wire which adjoins the at least one second filament.

17. A bonding wire according to claim 1, the diameter of which is at least 50 µm.

18. A bonded connection between
  a bonding wire comprising a matrix material and a filler embedded therein, wherein the coefficient of thermal expansion of the filler is lower than the coefficient of thermal expansion of the matrix material, and the filler content amounting to at least 25% of the weight of the bonding wire, and a substrate.

19. A bonded connection according to claim 18, wherein the substrate is substantially formed from silicon, germanium or gallium arsenide.

20. A bonded connection according to claim 18, formed directly between a metallization of the substrate and the bonding wire.

21. A bonded connection according to claim 20, wherein the metallization has a thickness of between 2 μm and 50 μm.

22. A bonded connection according to claim 18, produced by means of an ultrasound bonding process.

* * * * *

UNITED STATES PATENT AND TRADEMARK OFFICE
CERTIFICATE OF CORRECTION

PATENT NO. : 7,319,196 B2  Page 1 of 1
APPLICATION NO. : 11/221112
DATED : January 15, 2008
INVENTOR(S) : Guy LeFranc and Christof Klos It is certified that error appears in the above-identified patent and that said Letters Patent is hereby corrected as shown below:

On the Title Page, please make the following corrections:
Item (73) Assignee: EUPEC Europaeische Gesellschaft fuer ~~fur~~
Leistungshalbleiter mbH ~~mgH~~ (DE)

On the Title Page, please make the following correction:
Item (30)   Foreign Application Priority Data
   Sep. 6, 2004  (DE) .................................10 2004 043 020.9-34

Column 1, line 46-47, please make the following correction:
   Therefore, the object of the present invention is to provide ~~provided~~ a bonding wire for producing a bonded connection Column 5, line 37, please make the following correction:
   If, working on the basis of the above-mentioned values, a Signed and Sealed this Third Day of June, 2008

JON W. DUDAS
*Director of the United States Patent and Trademark Office*